(12) United States Patent
Liggins et al.

(10) Patent No.: US 9,210,972 B2
(45) Date of Patent: Dec. 15, 2015

(54) FREE-STANDING NON-PLANAR POLYCRYSTALLINE SYNTHETIC DIAMOND COMPONENTS AND METHOD OF FABRICATION

(71) Applicant: Element Six Technologies Limited, Oxfordshire (GB)

(72) Inventors: Stephanie Liggins, Oxfordshire (GB); John Robert Brandon, Oxfordshire (GB); Christopher John Howard Wort, Oxfordshire (GB); Neil Perkins, Oxfordshire (GB); Paul Nicholas Inglis, Ascot (GB); Mark Robin McClymont, Ascot (GB)

(73) Assignee: Element Six Technologies Limited, Oxfordshire (GB)

(*) Notice: Subject to any disclaimer, the term of this patent is extended or adjusted under 35 U.S.C. 154(b) by 0 days.

(21) Appl. No.: 14/401,958

(22) PCT Filed: May 23, 2013

(86) PCT No.: PCT/EP2013/060666
§ 371 (c)(1),
(2) Date: Nov. 18, 2014

(87) PCT Pub. No.: WO2013/178535
PCT Pub. Date: Dec. 5, 2013

(65) Prior Publication Data
US 2015/0110987 A1 Apr. 23, 2015

Related U.S. Application Data

(60) Provisional application No. 61/652,695, filed on May 29, 2012.

(30) Foreign Application Priority Data

May 28, 2012 (GB) .................. 1209424.9

(51) Int. Cl.
*C23C 16/01* (2006.01)
*A44C 17/00* (2006.01)
(Continued)

(52) U.S. Cl.
CPC ............... *A44C 17/007* (2013.01); *C23C 16/01* (2013.01); *C23C 16/27* (2013.01); *C23C 16/274* (2013.01);
(Continued)

(58) Field of Classification Search
USPC .................. 427/577; 428/156, 212, 332, 408
See application file for complete search history.

(56) References Cited

U.S. PATENT DOCUMENTS 5,261,959 A 11/1993 Gasworth
5,556,464 A 9/1996 Tanabe et al.
(Continued)

FOREIGN PATENT DOCUMENTS

CA 2034440 * 8/1991
EP 2108714 A1 10/2009
(Continued)

OTHER PUBLICATIONS

Mollart et al "CVD diamond optical components, multi-spectral properties and performance at elevated temperatures" Porc. SPIE vol. 4375 (2001) p. 180-198.*
(Continued)

*Primary Examiner* — Archene Turner
(74) *Attorney, Agent, or Firm* — Bryan Cave LLP

(57) ABSTRACT

A free-standing non-planar polycrystalline CVD synthetic diamond component which comprises a nucleation face and a growth face, the nucleation face comprising smaller grains than the growth face, the nucleation face having a surface roughness $R_a$ no more than 50 nm, wherein the free-standing non-planar polycrystalline CVD synthetic diamond component has a longest linear dimension when projected onto a plane of no less than 5 mm and is substantially crack free over at least a central region thereof, wherein the central region is at least 70% of a total area of the free-standing non-planar polycrystalline CVD synthetic diamond component, wherein the central region has no cracks which intersect both external major faces of the free-standing non-planar polycrystalline CVD synthetic diamond component and extend greater than 2 mm in length.

13 Claims, 6 Drawing Sheets

(51) Int. Cl.
*C23C 16/27* (2006.01)
*H04R 7/12* (2006.01)
*H04R 31/00* (2006.01)
*C23C 16/458* (2006.01)

(52) U.S. Cl.
CPC .............. *C23C 16/458* (2013.01); *H04R 7/127* (2013.01); *H04R 31/003* (2013.01); *H04R 2307/023* (2013.01)

(56) References Cited

U.S. PATENT DOCUMENTS

| | | | |
|---|---|---|---|
| 6,248,400 | B1 | 6/2001 | Kurihara et al. |
| 6,659,161 | B1 | 12/2003 | Sung |
| 8,309,205 | B2 * | 11/2012 | Nelissen et al. ............. 428/156 |
| 2003/0108476 | A1 * | 6/2003 | Woerner et al. ............. 423/446 |
| 2004/0031438 | A1 | 2/2004 | Sung |

FOREIGN PATENT DOCUMENTS

| | | |
|---|---|---|
| GB | 2427878 A | 1/2007 |
| GB | 2429367 A | 2/2007 |
| GB | 2486784 A | 6/2012 |
| JP | 59-143498 A | 8/1984 |
| JP | 60-141697 A | 7/1985 |
| JP | 04-161000 A | 6/1992 |
| WO | 01/73158 A1 | 10/2001 |
| WO | 2004/072319 A2 | 8/2004 |
| WO | 2005/101900 A1 | 10/2005 |

OTHER PUBLICATIONS

Wort et al "Recent advances in the quality of CVD diamond optical components" SPIE vol. 3705 (1991) p. 119-128.*
Savage et al "Properties of free-standing CVD diamond optical components" SPIE vol. 3060 (1997) p. 144-159.*
Whitfield, M., "Nucleation and growth of diamond films on single crystal and polycrystalline tungsten substrates", Diamond and Related Materials, vol. 9, Issues 3-6, Apr.-May 2000, 262.
International Search Report for PCT/EP2013/060666 dated Jan. 3, 2014.
Search Report for GB1209424.9 dated Jun. 22, 2012.
Search Report for GB1309326.5 dated Nov. 20, 2013.

* cited by examiner

FREE-STANDING NON-PLANAR POLYCRYSTALLINE SYNTHETIC DIAMOND COMPONENTS AND METHOD OF FABRICATION

FIELD OF INVENTION

Certain embodiments of the present invention relate to non-planar polycrystalline CVD synthetic diamond components, particularly, but not exclusively, speaker domes for high-end audio equipment.

BACKGROUND OF INVENTION

Diamonds have long been used in jewelry due to their long life and aesthetic appeal. Diamond materials also have a range of desirable properties for a large number of different technical applications. For example, diamond material is light in weight and very stiff/rigid. These properties result in diamond being an excellent material for use in forming a speaker dome for high-end audio equipment. Such speaker domes can form high frequency tweeters with a very high break-up frequency beyond the human audio range so as to produce a very high quality sound in the human audio range.

For example, WO2005/101900 discloses such a diamond speaker dome. As described in WO2005/101900, harmonics can extend below the fundamental break-up frequency so it is desirable for the break-up frequency to be well removed from the end of the human audio range to ensure that sound reproduction is not impaired by flexing of the speaker dome at high frequency oscillation. WO2005/101900 describes that a speaker dome having a very high break-up frequency can be provided by a synthetic diamond speaker dome having an integral peripheral skirt of specific dimensions. No details of the specific manufacturing method for fabricating such a speaker dome are recited in the document.

GB2429367 also discloses a diamond speaker dome and describes that such a dome can be fabricated by CVD synthetic diamond material on a convex curved substrate to form a synthetic diamond film thereon followed by separation of the synthetic diamond film from the substrate to yield a diamond speaker dome. No details are given regarding the material to be used as the substrate on which the synthetic diamond material is deposited and no details are given regarding the separation technique used to separate the synthetic diamond film from the substrate to yield the diamond speaker dome.

U.S. Pat. No. 5,556,464 and JP59143498 also disclose diamond speaker domes and describe that such speaker domes can be fabricated by chemical vapour deposition of synthetic diamond material on a convexly curved substrate to form a synthetic diamond film thereon followed by separation of the synthetic diamond film from the substrate to yield a diamond speaker dome. These documents give more detail regarding the fabrication process and describe that the synthetic diamond material is deposited on a convexly curved silicon substrate and that separation of the synthetic diamond film from the substrate to yield the diamond speaker dome is achieved by dissolving the silicon substrate in acid.

The present inventors have utilized the aforementioned silicon substrate-acid dissolution process to manufacture diamond speaker domes and confirmed that such an approach can be used to successfully manufacture diamond speaker domes at high yields without incurring cracking of the relatively delicate, brittle diamond speaker domes during the synthesis and substrate removal steps. As such, this approach provides a viable commercial route to fabrication of diamond speaker domes if synthesis conditions are appropriately controlled. However, a substantial cost in such a process for diamond speaker dome production resides in the cost of suitable convexly curved silicon substrates which are dissolved in acid and thus can only be used once. Furthermore, the actual process of silicon substrate acid dissolution is time consuming, costly, and hazardous. Given the nature of the adhesion of diamond to silicon, the substrate does not permit a release process which leaves the silicon substrate intact for re-use in fabricating further diamond speaker domes. Instead, post growth, silicon is required to be acid digested by, for example, HF/nitric acid.

An additional problem with using silicon as a substrate for CVD diamond growth in a CVD diamond growth process, particularly a microwave activated CVD diamond growth process, is power absorption by the silicon at high temperatures, leading to thermal runaway and fracture. Further still, silicon is readily incorporated into CVD diamond during growth, being particularly visible as the 737 nm Si—V defect. As such, the use of a silicon substrate can detrimentally affect the purity of the CVD diamond product.

In light of the above, the present inventors have recognized that it would be advantageous to seek an alternative to the silicon substrate-acid dissolution process to manufacture diamond speaker domes. In particular, it would be advantageous to provide a method in which a re-usable substrate could be employed for the growth of a diamond speaker dome wherein the substrate is left substantially unaffected by the growth procedure. This would allow substrates to be reused for numerous growth runs and would significantly reduce the associated costs of production. In addition, such a method would also avoid the costly and hazardous method of acid digestion.

The present inventors have thus investigated possible alternative methods and particularly the possibility of using convexly curved refractory metal substrates. In this regard, it is known that planar CVD synthetic diamond films can be grown on planar refractory metal substrates, such as molybdenum, tungsten, niobium, or alloys thereof. For example, U.S. Pat. No. 5,261,959 suggests a refractory metal substrate material such as molybdenum in the form of a planar circular disk. Alternatively, Whitfield et al. suggest the use of a tungsten substrate (see "Nucleation and growth of diamond films on single crystal and polycrystalline tungsten substrates", Diamond and Related Materials, Volume 9, Issues 3-6, April-May 2000, Pages 262-268). Specifically, Whitfield et al. disclose the use of a planar polycrystalline tungsten disc 6.3 mm thick and 50 mm in diameter and a single crystal tungsten disc 6.3 mm thick and 8 mm in diameter in a 2.45 GHz microwave plasma reactor. It is taught that substrates are subjected to preparation steps including polishing to a mirror finish with a 1-3 micrometer diamond abrasive and cleaning via ultrasonic washing and an in situ plasma etch. Substrate temperatures are monitored using optical pyrometry and an embedded thermocouple during CVD diamond growth. Spontaneous delamination of the CVD diamond wafer from the tungsten substrate on cooling after growth is also disclosed to yield a free-standing diamond wafer due to the differences in thermal expansion coefficient between the CVD diamond wafer and the tungsten substrate. Whitfield et al. note that generally in their experiments the substrates were not reused but in the few cases where re-use did occur, substrates were lapped and polished for at least 24 hours to remove the thin carbide layer formed during the previous growth run.

In light of the above, it is evident that carbide forming refractory metals may provide an attractive alternative to silicon substrates. Despite this, the present inventors have experienced a number of problems when using such substrates, even in a planar configuration. These include: non-uniform CVD diamond growth over the substrate; delamination of the CVD diamond wafer from the substrate during CVD diamond growth; and crack initiation and propagation during cooling after growth of the CVD diamond wafer. These problems tend to be exacerbated when larger substrates are used for growing large area polycrystalline diamond discs (e.g. 80 mm diameter or more). The problem has been found to be further exacerbated if non-planar substrates are provided such as convexly curved refractory metal substrates. Furthermore, these problems tend to be exacerbated when the substrates are reused in subsequent growth runs. This is particularly problematic as the substrates are expensive and reuse is desirable in an economically competitive industrial process.

Alternatives to the use of a silicon substrate-acid dissolution process to manufacture diamond speaker domes have been proposed in the art. For example, GB2427878 discusses that a diamond speaker dome can be grown on a metallic or non-metallic substrate but identifies potential problems with both approaches. With regard to metallic substrates it is identified that the diamond film grown thereon tends to crack during synthesis or on cooling. With regard to non-metallic substrates it is identified that such substrates are difficult to remove from a diamond film grown thereon. As such, GB2427878 would appear to identify some of the problems which have also been identified by the present inventors as discussed above. In order to solve these problems, GB2427878 suggests that a polycrystalline CVD synthetic diamond speaker dome could be grown on a convexly curved polymer substrate comprising a buffer layer. It is suggested that such a buffer layer may be formed of diamond-like carbon (DLC), amorphous carbon or nano-crystal diamond (NCD), or a metal or ceramic film. It is described that during diamond growth the polymer substrate is thermally decomposed to yield a composite speaker dome comprising a layer of polycrystalline CVD diamond material bonded to a layer of buffer material. Such a method is proposed in to avoid problems of cracking (as when using a solid metal substrate) and to avoid the problems of post-growth substrate removal (as when using a silicon substrate). However, the method described in GB2427878 does not allow for the reuse of substrates as each substrate is thermally decomposed during the diamond growth process. Furthermore, the resultant diamond speaker dome product comprises a layer of buffer material adhered to the diamond dome. Such a buffer layer will tend to detrimentally affect the acoustic properties of the speaker dome, for example by reducing the break-up frequency.

JP4161000 suggests the growth of a polycrystalline CVD diamond speaker dome on a convexly curved tungsten substrate followed by removal of the tungsten by acid dissolution. Such a process is in many respects the same as the previously described silicon substrate-acid dissolution process and possesses the same problems, i.e. the substrates cannot be reused and a costly and hazardous acid digestion step is still required to release the diamond speaker dome from its substrate.

JP60141697 would appear to solve some of the aforementioned problems. This document discloses a method of fabricating diamond speaker domes on a convexly curved substrate made of materials having high heat resistance and low thermal conductivity such as molybdenum and silicon. It is stated that a diamond film can be grown on such a substrate via a CVD technique. After diamond synthesis and cooling, a heating beam of light from an infrared lamp or a heater is irradiated and transmitted through the thin film of diamond to heat the surface of the substrate. It is suggested that the temperature of the substrate is not elevated as much as the diamond film due to the low thermal conductivity of the substrate material and that the diamond film thermally expands due to the temperature difference and is released from the substrate to obtain a free-standing diamond speaker dome.

In principle, it would appear that the method as described in JP60141697 could provide a route to manufacturing diamond speaker domes which allows re-use of substrates and also avoids a costly and hazardous acid digestion step. JP60141697 suggests that the thermally induced release process can be used for both metallic (molybdenum) and silicon substrates. However, as previously indicated, the present inventors have found that given the nature of the adhesion of diamond to silicon, the use of a silicon substrate does not permit a thermally induced release process which leaves the silicon substrate intact for re-use in fabricating further diamond speaker domes. Having regard to the use of metallic substrates such as molybdenum in such a process, as previously indicated, the present inventors have experienced a number of problems when using such metallic substrates including: non-uniform CVD diamond growth over the substrate; delamination of the CVD diamond wafer from the substrate during CVD diamond growth; and crack initiation and propagation during cooling after growth of the CVD diamond wafer. As previously stated, these problems already exist for planar refractory metal substrates and are exacerbated if non-planar substrates are provided such as convexly curved refractory metal substrates. Furthermore, these problems tend to be exacerbated when the substrates are reused in subsequent growth runs. These problems have also been alluded to in GB2427878 which identifies that a diamond film grown on a metal substrate tends to crack during synthesis or on cooling. JP60141697 does not appear to address these problems. Indeed, JP60141697 teaches that the diamond speaker dome remains adhered to the metallic substrate after cooling down from growth conditions and prior to application of a heating beam. The mismatch in thermal expansion coefficient between a diamond film and a metallic substrate on cooling after CVD diamond growth would result in a large amount of thermal stress on the diamond speaker dome due to thermal expansion coefficient mismatch with the underlying substrate to which it is bonded. As such the resultant speaker domes would be likely to contain cracks. Furthermore, JP60141697 still requires a post-growth treatment step to remove the domes which will add time and cost to the manufacturing process.

It is an aim of certain embodiments of the present invention to solve the aforementioned problems. In particular, embodiments of the present invention aim to provide a method of fabricating a diamond speaker dome which permits the controlled delamination of a diamond speaker dome from a reusable substrate without incurring cracking of the diamond speaker dome, without damaging the substrate so that it can be reused, and without requiring post growth treatment steps to achieve delamination.

SUMMARY OF INVENTION

According to a first aspect of the present invention there is provided a free-standing non-planar polycrystalline CVD synthetic diamond component which comprises a nucleation face and a growth face, the nucleation face comprising smaller grains than the growth face, the nucleation face having a surface roughness $R_a$ no more than 50 nm, wherein the free-standing non-planar polycrystalline CVD synthetic diamond component has a longest linear dimension when projected onto a plane of no less than 5 mm and is substantially crack free over at least a central region thereof, wherein the central region is at least 70% of a total area of the free-standing non-planar polycrystalline CVD synthetic diamond component, wherein the central region has no cracks which intersect both external major faces of the free-standing non-planar polycrystalline CVD synthetic diamond component and extend greater than 2 mm in length.

According to a second aspect of the present invention there is provided a method of fabricating a free-standing non-planar polycrystalline CVD synthetic diamond component, the method comprising:

treating a non-planar surface of a carbide forming refractory metal substrate to form a metal carbide layer on said non-planar surface with a surface roughness $R_a$ no more than 50 nm;

growing a film of polycrystalline CVD synthetic diamond material on said non-planar surface in a CVD reactor at a growth temperature in a range 700° C. to 1300° C.; and cooling the carbide forming refractory metal substrate and the film of polycrystalline CVD synthetic diamond material at a controlled rate whereby the film of polycrystalline CVD synthetic diamond material delaminates from the metal carbide surface of the carbide forming refractory metal substrate during cooling to yield a free-standing non-planar polycrystalline CVD synthetic diamond component which has a nucleation face having a surface roughness $R_a$ no more than 50 nm and which is substantially crack free over at least a central region thereof, wherein the central region is at least 70% of a total area of the free-standing non-planar polycrystalline CVD synthetic diamond component, and wherein the central region has no cracks which intersect both external major faces of the free-standing non-planar polycrystalline CVD synthetic diamond component and extend greater than 2 mm in length.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1:
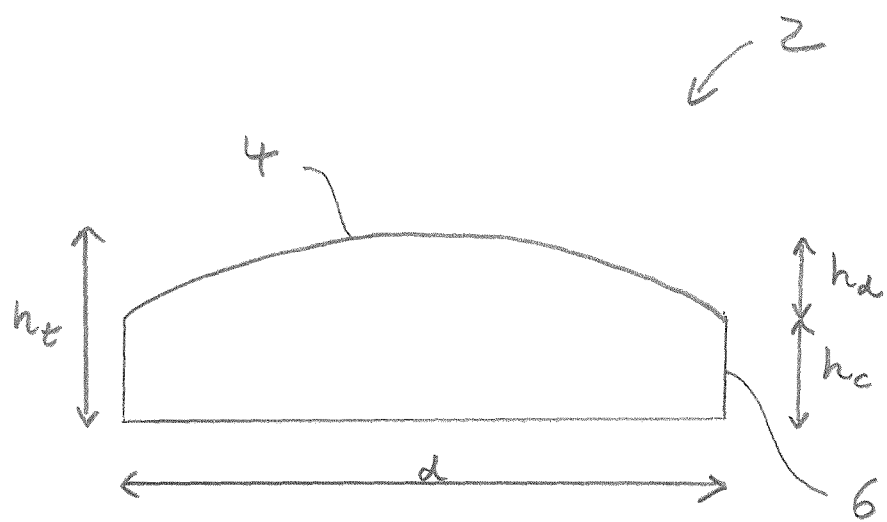
FIG. 1 illustrates a cross-sectional view of an example of a carbide forming refractory metal substrate for use in fabricating a non-planar polycrystalline CVD synthetic diamond component in accordance with an embodiment of the present invention.

Thin diamond films (e.g. <100 micron thick) do not readily release intact from substrates on which they are grown. CVD diamond is grown at elevated temperatures of order 800-1100° C. and on cooling to ambient temperature a thermal mismatch is generated between the diamond film and the substrate by virtue of the difference in thermal expansion coefficient (TCE). Since diamond has a low thermal expansion coefficient compared to the substrate it is nominally placed in compression although a component of stress normal to the interface is generated depending on the radius of curvature. Whether the diamond film remains adhered to the surface depends on several parameters: the mismatch strain; the radius of curvature of the surface; and the level of adhesion between the two layers. Delamination thus occurs more readily as the temperature, the radius of curvature at the interface, and the level of adhesion all reduce or the thickness of the diamond film increases. Thicker diamond films are arguably more likely to survive the delamination process by virtue of their increased mechanical robustness. The conclusion from this simple analysis is that for a thin diamond film to delaminate intact from a substrate the level of adhesion between diamond and substrate should be low. Therefore the fundamental problem to be solved is to reduce the interfacial strength of diamond to its substrate. For typical substrate materials two factors determine interfacial strength: (a) the strength of any chemical bond that develops between the two layers, e.g. silicon forms a strong carbide at the interface; and (b) the level of mechanical adhesion between the two layers. In the latter case it can be argued that a perfectly smooth interface free of asperities will show negligible mechanical adhesion. The challenge therefore is to produce such a surface with very weak chemical and mechanical bonding.

Embodiments of the present invention provide a method of fabricating a diamond speaker dome which permits the controlled delamination of the diamond speaker dome from a reusable substrate without incurring cracking of the diamond speaker dome, without damaging the substrate so that it can be reused, and without requiring post growth treatment steps to achieve delamination. A carbide forming refractory metal substrate comprising a non-planar surface is provided as the reusable substrate. The carbide forming refractory metal substrate can be formed of a metal selected from the group consisting of: tungsten; molybdenum; niobium; and alloys thereof such as a tungsten-nickel-iron alloy (DENSIMET™). For example, the substrate may be formed of a solid block of such a material having provides a non-planar growth surface and a planar base.

It has been found that careful growth surface preparation and maintenance of such a carefully prepared growth surface is a key feature required to achieve controlled delamination from such a substrate and yield substantially crack-free speaker domes while enabling the substrate to be reused for further speak dome fabrication. In particular, it has been found that it is advantageous to provide and maintain a metal carbide surface layer on the substrate having a surface roughness $R_a$ no more than 50 nm, 40 nm, 30 nm, 20 nm, or 10 nm. Such a surface can be seeded by treating with an abrasive powder, such as a diamond powder, to form a seeded metal carbide surface for polycrystalline CVD synthetic diamond growth. The seeding can be controlled such that the seeded metal carbide surface retains a low surface roughness $R_a$ as defined.

After preparing such a substrate growth surface, a film of polycrystalline CVD synthetic diamond material can be grown thereon in a CVD reactor at a growth temperature in a range 700° C. to 1300° C., 800° C. to 1200° C., 900° C. to 1200° C., 950° C. to 1150° C., or 1000° C. to 1100° C.

After growth, the carbide forming refractory metal substrate and the film of polycrystalline CVD synthetic diamond material are cooled at a controlled rate whereby the film of polycrystalline CVD synthetic diamond material delaminates from the metal carbide surface of the carbide forming refractory metal substrate during cooling to yield a free-standing non-planar polycrystalline CVD synthetic diamond component. Due to the low surface roughness of the substrate growth surface, the resultant free-standing non-planar polycrystalline CVD synthetic diamond component will comprise a nucleation face having a low surface roughness corresponding to that of the growth surface. The combination of the carefully prepared growth surface and the controlled cooling after CVD diamond growth enables controlled delamination to be achieved yielding a substantially crack-free non-planar polycrystalline CVD synthetic diamond component. Preferably the non-planar polycrystalline CVD synthetic diamond component has no significant cracks, at least over a majority of the component. For example, the non-planar polycrystalline CVD synthetic diamond component may comprise a central region which is at least 70%, 80%, 80%, 90%, or 95% of a total area of the free-standing non-planar polycrystalline CVD synthetic diamond component, and the central region has no cracks which intersect both external major faces of the free-standing non-planar polycrystalline CVD synthetic diamond component and extend greater than 2 mm in length.

The substrate can then be re-used for fabricating more non-planar polycrystalline CVD synthetic diamond components. When the carbide forming refractory metal substrate is reused in multiple growth runs, the carbide forming refractory metal substrate is re-seed prior to each growth run. The surface roughness of the substrate growth surface can be monitored between growth runs and is only required to be re-polished when the surface roughness $R_a$ of the metal carbide layer becomes too high, e.g. exceeds 50 nm, 40 nm, 30 nm, or 20 nm. An increase in surface roughness can be caused by repeated seeding but the dominant mechanism is likely to be metal-carbide grains been pulled out of the growth surface during delamination of diamond material therefrom.

The polycrystalline CVD synthetic diamond components as described herein can be grown using a variety of methods including hot filament, microwave plasma, and DC arc jet reactors. Each of these methods has its virtues. DC arc jet deposition systems tend to have high localized growth rates, but suffer from electrode/nozzle erosion, high gas consumption and relatively poor area coverage. Hot filament reactors can coat large areas and 3D shapes but with limited film thickness and with relatively poor quality of diamond. In contrast microwave plasma CVD diamond has become established as the leading method for producing high quality, bulk diamond. Unfortunately microwave plasma methods have only limited capabilities to coat non-planar substrates due to the interaction of the microwave electric field and the non-planar substrate. Coating of even simple 3D shapes such as tool inserts or loudspeaker dome mandrels is made difficult by the effects of electric field concentrations at external corners or conversely the weakness in electric fields at internal corners. This variation in the electric field adversely affects the uniformity of both quality and thickness of the diamond film. For example microwave plasma CVD reactors cannot usually be used to conformally coat cutting tool inserts. At the corners high electric fields lead to thickening and rounding of the critical cutting edges, thus making them unsuitable for the intended purpose. Materials that are thermally sensitive in terms of melting point or thermal shock are even more challenging to coat uniformly in a microwave plasma reactor.

In light of the above, one would expect that a microwave plasma process would not be suitable for implementing embodiments of the present invention. However, surprisingly it has been found that if a microwave plasma CVD apparatus is configured as described herein, if the surface of the substrate is carefully processed as described herein, and if the growth and cooling cycle is carefully controlled as described herein then it is possible to perform the present invention using a microwave plasma CVD process. Since such a process results in higher quality diamond material when compared with alternative growth methods, it can thus be advantageous to use a microwave plasma CVD reactor, most preferably at relatively high powers and pressures, in order to fabricate high quality polycrystalline CVD synthetic diamond material. For example, the CVD reactor may be operated at a microwave frequency in a range 800 MHz to 1000 mHz with a pressure of at least 140 Torr, 160 Torr, 180 Torr, 200 Torr, 230 Torr, 260 Torr, or 300 Torr, and/or a microwave power of at least 10 kW, 15 kW, 20 kW, 25 kW, or 30 kW. If high operating powers and pressures are utilized for CVD diamond growth, cooling after growth can be achieved by reduction of power and pressure within the CVD reactor to avoid thermally induced cracking of the polycrystalline CVD synthetic diamond component. For example, the controlled rate of cooling may comprise reducing the growth temperature down to at least 800° C., 750° C., 700° C., 650° C. or 600° C. over a time period of at least 10 minutes, 15 minutes, or 20 minutes prior to extinguishing plasma in the CVD reactor.

Problems of arcing within the plasma can be alleviated at high powers and pressures by using a high process gas flow axially oriented towards the substrate during CVD diamond growth. For example, a total flow rate of the process gas may be no less than 2100 sccm, 2600 sccm, 2800 sccm, 3000 sccm, or 3100 sccm. The process gas may comprise one or more of: a carbon containing gas in a range 1 to 10%, 1 to 7%, 2 to 5%, 2 to 4%, or 2.5 to 3.5% of a total process gas flow rate; an inert gas, such as argon, in a range 0.5 to 10%, 0.5 to 7%, 0.5 to 5%, 0.5 to 3%, or 1.0 to 2.0% of a total process gas flow rate; and hydrogen in a range 85 to 98%, 90 to 98%, 93.0 to 97.5%, 94.0 to 96.5%, or 95.0% to 96% of a total process gas flow rate. The process gas is directed towards the substrate through one or more gas inlet nozzles disposed opposite the substrate within the CVD reactor.

It is envisaged that a range of non-planar polycrystalline CVD synthetic diamond components could be manufactured using the process as described herein. However, the process has been specifically developed for fabricated diamond speaker domes for audio applications. In this case, the non-planar surface of the carbide forming refractory metal substrate provides a dome-shaped growth surface. This may be concave or convex, convex being preferred to achieve better controlled delamination of a diamond speaker dome grown thereon. Typical dimensions for the dome-shaped growth surface include:

a diameter in a range 5 mm to 50 mm, 10 mm to 40 mm, 15 mm to 35 mm, or 20 mm to 30 mm; and a radius of curvature in a range 10 mm to 80 mm, 20 mm to 70 mm, 30 mm to 60 mm, 40 mm to 55 mm, or 45 mm to 55 mm.

Such dimensions allow controlled release of a speaker dome. Advantageously, a speaker dome comprises an integral peripheral skirt as described in the prior art discussed in the background section. To fabricate such an integral skirt, the non-planar surface of the carbide forming refractory metal substrate may be formed to have a substantially cylindrical peripheral portion extending from an outer circumference of the dome-shaped growth surface and having side walls oriented within 20°, 10°, 5°, 2°, or 1° of a central rotational axis of the non-planar surface of the carbide forming refractory metal substrate. In order to achieve coherent diamond growth at an interface region between the dome portion and the skirt portion of the speaker dome, it has also been found to be advantageous to provide the substrate which has at least a portion adjacent the outer circumference of the dome-shaped growth surface that forms an angle in a range 2° to 20°, 3° to 10°, 4° to 7°, or 5° to 6° relative to the central rotational axis of the carbide forming refractory metal substrate. It has been found that providing such an angled transitional portion between the dome shaped region and the cylindrical side wall enables an integral skirt to be formed during CVD diamond growth and component delamination without cracking in this region. Corner regions forming transitions between the different portions of the growth surface may also be rounded to aid delamination without cracking.

The substantially cylindrical peripheral portion may have a depth in a range 1 to 10 mm, 2 to 8 mm, 3 to 6 mm, or 3.5 mm to 5 mm. This is substantially larger than the usual desirable skirt length for a speaker dome. Such a thick peripheral region has been found to be advantageous for use with a separate peripheral guard collar component in order to define the skirt length. The guard collar is located around a peripheral edge of the substantially cylindrical peripheral portion and creates a dead-space for diamond growth to permit "pinching off" of diamond growth at a location on the substantially cylindrical peripheral portion. This "pinching off" of diamond growth provides a region of detachment on cooling to achieve controlled delamination and yield the free-standing non-planar polycrystalline CVD synthetic diamond component. A difference in depth between the guard collar and the substantially cylindrical peripheral portion corresponds to a target skirt length. As such, this difference in depth may lie in a range 0.2 mm to 2.0 mm, 0.2 mm to 1.5 mm, 0.3 mm to 1.0 mm, 0.4 mm to 0.8 mm, or 0.5 mm to 0.75 mm. The previously defined low roughness surface should extend over the dome portion of the substrate and at least down a portion of the substantially cylindrical peripheral portion on which the skirt of the speaker dome is grown.

Temperature control across the growth surface of the substrate can be important to ensure relatively uniform CVD diamond growth thereon. Temperature control can be achieved by providing a gas gap under the substrate and providing gas at a controlled rate and composition within the gas gap to vary thermal conductivity and thus control the temperature of the overlying substrate. To optimize temperature uniformity between an apex and a peripheral; circumference of the dome it has been found to be advantageous to support the substrate on a metallic pedestal within the CVD reactor with a gas gap defined between the carbide forming refractory metal substrate and the metallic pedestal under at least a peripheral region of the carbide forming refractory metal substrate. For example, the gas gap may have a first height under a central region of the substrate and a second height under a peripheral region of the substrate, the second height being larger than the first height to reduce cooling at a peripheral region of the substrate. This modification adds an extra thermal resistance term which may be compensated for by using a pedestal material which has a high thermal conductivity, e.g. oxygen free high conductivity (OFHC) copper.

In order to achieve a commercially viable manufacturing process it is advantageous to provide a plurality of carbide forming refractory metal substrates within the CVD reactor in a single growth run. Eight or more carbide forming refractory metal substrates may be provided within the CVD reactor in a single growth run. For example, a single central substrate may be provided with seven further substrates located around the central substrate.

The present inventors have found that one problem with providing multiple non-planar substrates in a microwave plasma CVD diamond synthesis process is that a non-uniform electric field can be generated across the profiled substrates and this can lead to non-uniform diamond deposition. In particular, it has been found that the electric field intensity is higher at an outer edge of each substrate compared to an inner edge relative to the central axis of the plasma chamber. It is believed that this is caused by high order evanescent microwave modes. As such, it is desirable to configure the substrate arrangement to reduce the electric field intensity at an outer edge of each substrate such that the electric field intensity is relatively uniform across the profiled substrates. For example, a difference in electric field intensity between an inner and outer edge of each substrate may be no more than 10%, 8%, 5%, or 2% of the electric field intensity at the inner edge. This may be achieved in a number of different ways as discussed below:

(i) Use of a mono-mode plasma chamber, such as a $TM_{011}$ mode plasma chamber, can aid in providing a stable electric field and minimize interference from multiple modes.

(ii) Providing a prime number of off-axis non-planar substrates (i.e. excluding a substrate located on the central rotational axis of the plasma chamber) can aid in minimizing non-uniformities in the electric field caused by structural components located within the plasma chamber. Preferably the plasma chamber is also provided with a prime number of microwave inlet apertures to minimize non-uniformities in the electric field within the plasma chamber.

(iii) Mode cancelling blocks may be positioned within the plasma chamber to reduce interference from multiple modes. In this regard, each microwave inlet aperture is in effect equivalent to a rectangular waveguide. A three way aperture can help to maximize the length of the aperture. Four and six way alternatives have both been found to be deficient from the point of view of mode stability. Despite the presence of several apertures, the power can be predominantly coupled into the cavity in a $TM_{0mn}$ mode. There are effects from the symmetry of the apertures visible in the form of the generation of high order modes i.e. $TM_{lmn}$ (where l does not equal zero). Thus a three way aperture in which all three apertures are excited in phase will couple to the $TM_{3mn}$ series of modes while the four and six way apertures might be expected to couple with the much higher order $TM_{8mn}$ and $TM_{12mn}$ modes. In practice however, the four and six way apertures are prone to parasitic modes. Thus a four or six way aperture can couple into the $TM_{2mn}$ modes. Overall the effect is that the four and six way apertures can produce asymmetries in the plasma that result in either the plasma moving off centre or splitting two ways. The three way aperture gives a stable three way pulling effect that is less undesirable than the more serious one way and two way break-up modes that occur with other configurations. Instabilities can be dealt with using mode cancelling blocks which are basically metal bodies that produce a perturbation to the local electric field that is intended to cancel that of the three way mode produced by the apertures. The position of these metal blocks can be established empirically. By placing them in regions of high wall current (i.e. where the H field is high) the blocks can be used to disrupt the unwanted mode. As such in one arrangement a plurality of mode cancelling blocks are disposed on an inner wall of the plasma chamber, for example on a side wall or on a base of the chamber, the mode cancelling blocks being configured to compensate for electromagnetic perturbations caused by the plurality of apertures. The mode cancelling blocks are spaced apart so as to be symmetrically related to the aperture configuration. For example, the number of mode cancelling blocks may be equal to the number of apertures provided in the waveguide plate, the mode cancelling blocks being positioned to have a symmetry which corresponds to the aperture arrangement. For example, if three apertures are provided in the waveguide plate then three mode cancelling blocks may be mounted around the plasma chamber wall in a lower portion of the plasma chamber and arranged symmetrically so as to cancel perturbations in the electric field caused by the apertures. Alternatively, the number of mode cancelling blocks may be an integer multiple of the number of apertures while still being arranged to be symmetrically related to the aperture configuration. The mode cancelling blocks can be adhered to an inner wall of the plasma chamber or may be integrally formed by a wall of the plasma chamber.

(iv) The substrate configuration can be arranged to reduce the electric field intensity at an outer edge of each substrate relative to an inner edge thus compensating for higher electric field intensities found at the outer edge of each substrate. This may be achieved in a number of ways:

(a) Positioning mode cancelling blocks near an outer edge of each substrate to reduce the electric field intensity at the outer edge of each substrate.

(b) Lowering the local height of an outer edge of each substrate relative to an inner edge can compensate for non-uniformities in the electric field intensity between inner and outer edges. This may be achieved by angling the substrates relative to a support surface over which the substrates are disposed or otherwise angling the support surface such that the height of an outer edge of the substrates from the support surface is lower than the height of an inner edge of the substrates from the support surface.

In relation to point (iv)(b), it has been found to be advantageous to angle the non-central substrates outwardly with respect to a central axis of the CVD reactor. By angling the substrates outwardly is has been found that the intensity of the electric field on an outer edge of such a substrate is reduced while the intensity at the inner edge of such an angled substrate is increased. This has been found to improve the uniformity of CVD diamond growth on substrates which are not centrally positioned within the CVD reactor. For example, one or more of the plurality of carbide forming refractory metal substrates may be oriented to have a central rotational axis disposed at an angle in a range 1° to 35°, 2° to 25°, 3° to 20°, or 4° to 15° relative to a central axis of the CVD reactor.

Alternatively, a similar effect can be achieved by mounting the substrates in a parallel orientation relative to a central axis of the CVD reactor but providing a support surface which is inclined under the one or more of carbide forming refractory metal substrates such that the height of the support surface is raised at an outer edge of the substrates relative to an inner edge of the substrates. This has a corresponding effect of reducing the intensity of the electric field on an outer edge of the substrates while the intensity at the inner edge of the substrates is increased.

The aforementioned process has thus been found to be advantageous in providing a commercial route to fabricated free-standing non-planar polycrystalline CVD synthetic diamond components. The resultant components have features which are inherent to the process of fabrication. For example, the components will comprise a nucleation face and a growth face, the nucleation face comprising smaller grains than the growth face, with the nucleation face having a low surface roughness $R_a$ reflecting the low surface roughness of the growth surface on which they were fabricated. Furthermore, the components will be substantially crack free as previously described. Accordingly, one aspect of the present invention provides a free-standing non-planar polycrystalline CVD synthetic diamond component which comprises a nucleation face and a growth face, the nucleation face comprising smaller grains than the growth face, the nucleation face having a surface roughness $R_a$ no more than 50 nm, 40 nm, 30 nm, 20 nm, or 10 nm, wherein the free-standing non-planar polycrystalline CVD synthetic diamond component has a longest linear dimension when projected onto a plane of no less than 5 mm and is substantially crack free over at least a central region thereof, wherein the central region is at least 70%, 80%, 80%, 90%, or 95% of a total area of the free-standing non-planar polycrystalline CVD synthetic diamond component, wherein the central region has no cracks which intersect both external major faces of the free-standing non-planar polycrystalline CVD synthetic diamond component and extend greater than 2 mm, 1.5 mm, 1.0 mm, 0.5 mm, or 0.2 mm in length.

Further features will be indicative of a component which has been fabricated on a carbide forming refractory metal substrate according to an embodiment of the present invention in contrast with components grown on silicon substrates. For example, the free-standing non-planar polycrystalline CVD synthetic diamond component may further comprising one or more of the following characteristics:

(i) a silicon concentration as measured by secondary ion mass spectrometry of no more than $10^{17}$ atoms cm$^{-3}$, $5 \times 10^{16}$ atoms cm$^{-3}$, $10^{16}$ atoms cm$^{-3}$, $5 \times 10^{15}$ atoms cm$^{-3}$, or $10^{15}$ atoms cm$^{-3}$;

(ii) a difference in silicon concentration between the nucleation face and the growth face of the free-standing non-planar polycrystalline CVD synthetic diamond component of no more than $10^{17}$ atoms cm$^{-3}$, $5 \times 10^{16}$ atoms cm$^{-3}$, $10^{16}$ atoms cm$^{-3}$, $5 \times 10^{15}$ atoms cm$^{-3}$, or $10^{15}$ atoms cm$^{-3}$;

(iii) no detectable silicon carbide at the nucleation face of the free-standing non-planar polycrystalline CVD synthetic diamond component; and (iv) a detectable level of a refractory metal carbide at the nucleation face of the free-standing non-planar polycrystalline CVD synthetic diamond component.

Having regard to feature (i), components which are not grown on a silicon substrate and where no other significant sources of silicon are present within the CVD reactor will comprise substantially no silicon. This contrasts with components grown on silicon substrates where silicon from the substrate will be incorporated into the non-planar polycrystalline CVD synthetic diamond component during growth.

Having regard to feature (ii), components which are not grown on a refractory metal substrate may still comprise significant quantities of silicon if another significant sources of silicon is present within the CVD reactor. For example, CVD reactor chambers which comprise a bell jar will tend to result in silicon from the bell jar being incorporated into a diamond component grown within the bell jar. However, such silicon will usually be incorporated in a substantially uniform manner during the growth of the diamond component. This can be contrasted with growth on a silicon substrate where significant quantities of silicon from the substrate can be incorporated into the nucleation face of a diamond component grown thereon but as diamond growth proceeds the silicon substrate is coated with diamond which significantly reduces the amount of silicon being incorporated into the diamond component at the growth face. As such, while components grown on a silicon substrate will tend to exhibit a higher concentration of silicon at the nucleation face when compared to the growth face, components grown on refractory metal substrates will usually not exhibit such a concentration gradient, even if other sources of silicon are present within the CVD reactor.

Having regard to feature (iii), components grown on a silicon substrate will tend to have a detectable level of silicon carbide at the nucleation face, even after acid dissolution of the silicon substrate. This contrasts with components grown on refractory metal substrates which will tend to have no detectable silicon carbide at the nucleation face.

Finally, having regard to feature (iv), components grown on a refractory metal substrate will tend to have a detectable level of refractory metal carbide at the nucleation face. This contrasts with components grown on silicon substrates which will tend to have no detectable refractory metal carbide at the nucleation face.

Free-standing non-planar polycrystalline CVD synthetic diamond components according to certain embodiments of the present invention may have one or more of the following dimensional characteristics:
  a longest linear dimension when projected onto a plane of no less than 5 mm, 10 mm, 15 mm, 20 mm, or 25 mm, for example in a range 5 mm to 50 mm, 10 mm to 40 mm, 15 mm to 35 mm, or 20 mm to 30 mm; and
  a thickness of no more than 500 µm, 400 µm, 300 µm, 200 µm, 100 µm, 75 µm, or 50 µm, for example in a range 20 µm to 100 µm, 30 µm to 90 µm, 30 µm to 80 µm, 35 µm to 70 µm, 35 µm to 60 µm, or 35 µm to 55 µm.

It will be appreciated that the process as described herein is capable of controlled, crack-free delamination of relatively large, thin components. If the component is a diamond speaker dome is may a central dome-shaped portion, preferably with a convex nucleation face, having one or more of the following dimensional characteristics:
  a radius of curvature in a range 10 mm to 80 mm, 20 mm to 70 mm, 30 mm to 60 mm, 40 mm to 55 mm, or 45 mm to 55 mm;
  a radial thickness variation of no more than 40%, 30%, 25%, or 22% or a mean radial thickness; and
  a circumferential thickness variation of no more than 20%, 15%, or 22% of a mean circumferential thickness.

The speaker dome component preferably also comprises a "skirt" formed of a substantially cylindrical peripheral portion extending from an outer circumference of the dome-shaped portion. Such a skirt may have a side wall oriented within 20°, 10°, 5°, 2°, or 1° of a central rotational axis of the free-standing non-planar polycrystalline CVD synthetic diamond component. Furthermore, the side wall of the substantially cylindrical peripheral portion may comprise at least a portion adjacent the outer circumference of the dome-shaped portion that forms an angle in a range 2° to 20°, 3° to 10°, 4° to 7°, or 5° to 6° relative to the central rotational axis of the free-standing non-planar polycrystalline CVD synthetic diamond component. As previously described, providing such an angled transitional portion between the dome and skirt portions aids in achieving CVD diamond growth and controlled, crack free delamination of the component from the underlying substrate during the manufacturing process. The skirt preferably has a depth in a range 0.2 mm to 2.0 mm, 0.2 mm to 1.5 mm, 0.3 mm to 1.0 mm, 0.4 mm to 0.8 mm, or 0.5 mm to 0.75 mm. Such a skirt depth has been found to provide good acoustic characteristics in speaker dome applications. To further enhance acoustic characteristics the speaker dome is also preferably very light in weight. For example, the component may have a mass in a range 50 mg to 110 mg, 60 mg to 100 mg, 65 mg to 90 mg, 70 mg to 85 mg, or 70 mg to 80 mg.

Speaker domes as manufactured above may thus have excellent acoustics characteristics such as a break-up frequency greater than 25 kHz, 35 kHz, 45 kHz, or 55 kHz, 60 kHZ, or 70 kHz and a deviation in an on-axis response curve from a flat response, measured at ⅘ of the break-up frequency, of less than 3 dB.

FIG. 1 illustrates a cross-sectional view of an example of a carbide forming refractory metal substrate 2 for use in fabricating a non-planar polycrystalline CVD synthetic diamond component in accordance with an embodiment of the present invention. The substrate 2 is a pure tungsten substrate comprising a dome-shaped portion 4 and a substantially cylindrical portion 6. The dome-shaped portion has a height $h_d$ of 3.5 mm, a diameter d of 25.5 mm, and a radius of curvature of 25 mm. The height $h_c$ of the substantially cylindrical portion is 4.43 mm and thus the overall height $h_t$ of the substrate is 7.93 mm.

From the shoulder of the dome there is a 5° draft angle over 0.91 mm before a vertical edge to the substrate. This is shown in more detail in FIG. 2 which illustrates a cross-sectional view of a shoulder portion of the carbide forming refractory metal substrate shown in FIG. 1. An angled transition portion 8 is provided between the dome-shaped portion 4 and the cylindrical portion 6 of the carbide forming refractory metal substrate.

The as-manufactured substrate has a surface roughness $R_a$>1000 nm over all surfaces which is then lapped and polished to the desired $R_a$ of <20 nm. The lapping and polishing process includes both the dome portion 2 and substantially cylindrical portion 4.

Figure 2:
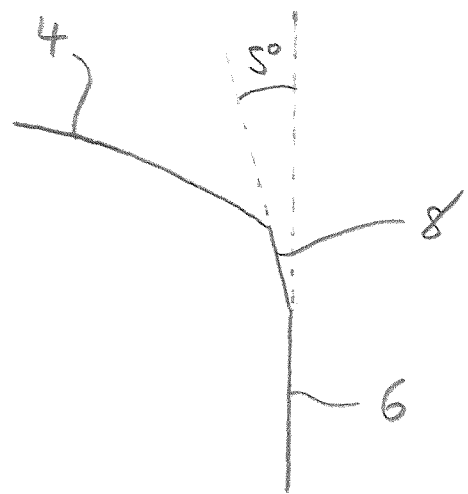
FIG. 2 illustrates a cross-sectional view of a shoulder portion of the carbide forming refractory metal substrate shown in FIG. 1 illustrating an angled transition portion between a dome-shaped portion and a cylindrical portion of the carbide forming refractory metal substrate.
Figure 3:
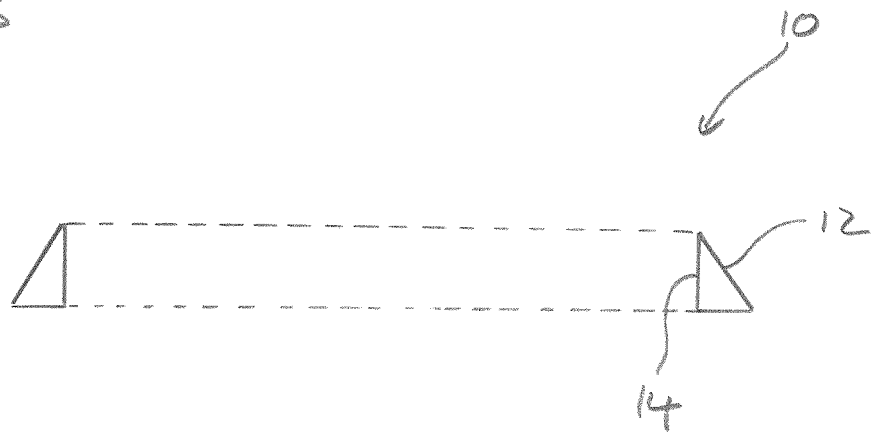
FIG. 3 illustrates a cross-sectional view of a guard collar which can be disposed around the carbide forming refractory metal substrate shown in FIGS. 1 and 2 within a CVD reactor to permit "pinching off" of diamond growth and define a region of detachment for controlled delamination of a non-planar polycrystalline CVD synthetic diamond component grown on the carbide forming refractory metal substrate.

FIG. 3 illustrates a cross-sectional view of a guard collar 10 which can be disposed around the carbide forming refractory metal substrate shown in FIGS. 1 and 2 within a CVD reactor to permit "pinching off" of diamond growth and define a region of detachment for controlled delamination of a non-planar polycrystalline CVD synthetic diamond component grown on the carbide forming refractory metal substrate.

The illustrated guard collar currently has a sharp profile design comprising a sloped outer surface 12 but variations are possible. That said, flat tipped guard collars and flat tipped collars have been tested with lesser success generally governed by the propensity for overgrowth between the guard collar and substrate. It is also envisaged that the guard collar may be provided with steps on an internal wall 14 to control a volume of a dead-space region between the guard collar and the substrate which will affect detachment.

In use, the guard collar 10 is located around an outer edge of the substrate. This guard collar defines the skirt profile of the grown diamond component, the height of the collar relative to the height of the substantially cylindrical portion of the substrate defining the length of the skirt.

Figure 4:
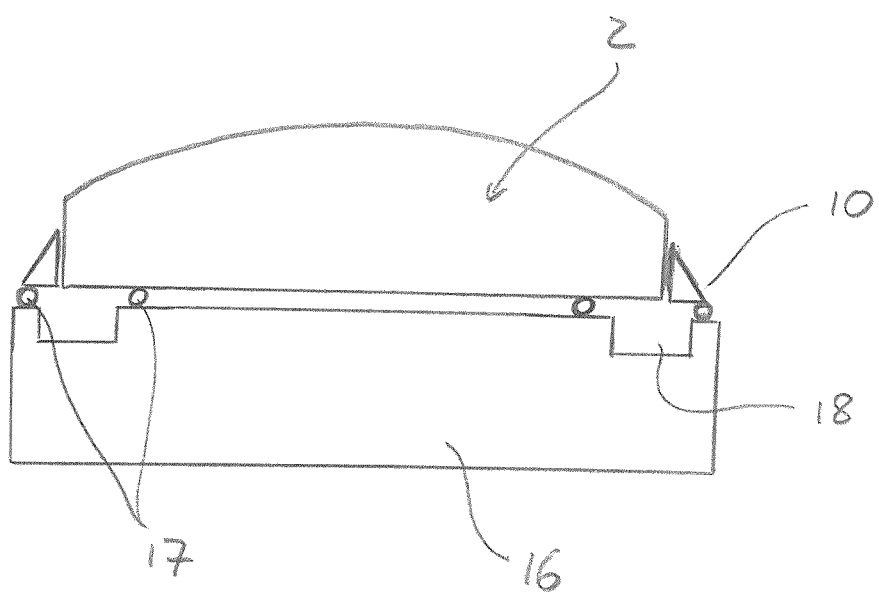
FIG. 4 illustrates a cross-sectional view of the carbide forming refractory metal substrate and the guard collar mounted on a pedestal with an gas gap defined under a peripheral region of the carbide forming refractory metal substrate.

FIG. 4 illustrates a cross-sectional view of the carbide forming refractory metal substrate 2 and the guard collar 10 mounted on a pedestal 16 and spaced apart therefrom via spacer wires 17 to form a gas gap 18 between the pedestal and the carbide forming refractory metal substrate and guard collar. The pedestal is designed to increase the gas gap beneath the guard collar and/or peripheral region of the substrate to optimise the temperature uniformity between the apex of the dome and the shoulder, the guard collar previously being seen to draw height out of the edge of the substrate leading to thinner growth of the dome. This modification adds an extra thermal resistance term which is compensated for by using a pedestal material with high thermal conductivity. Therefore OFHC copper material was chosen for the pedestal.

Figure 5:
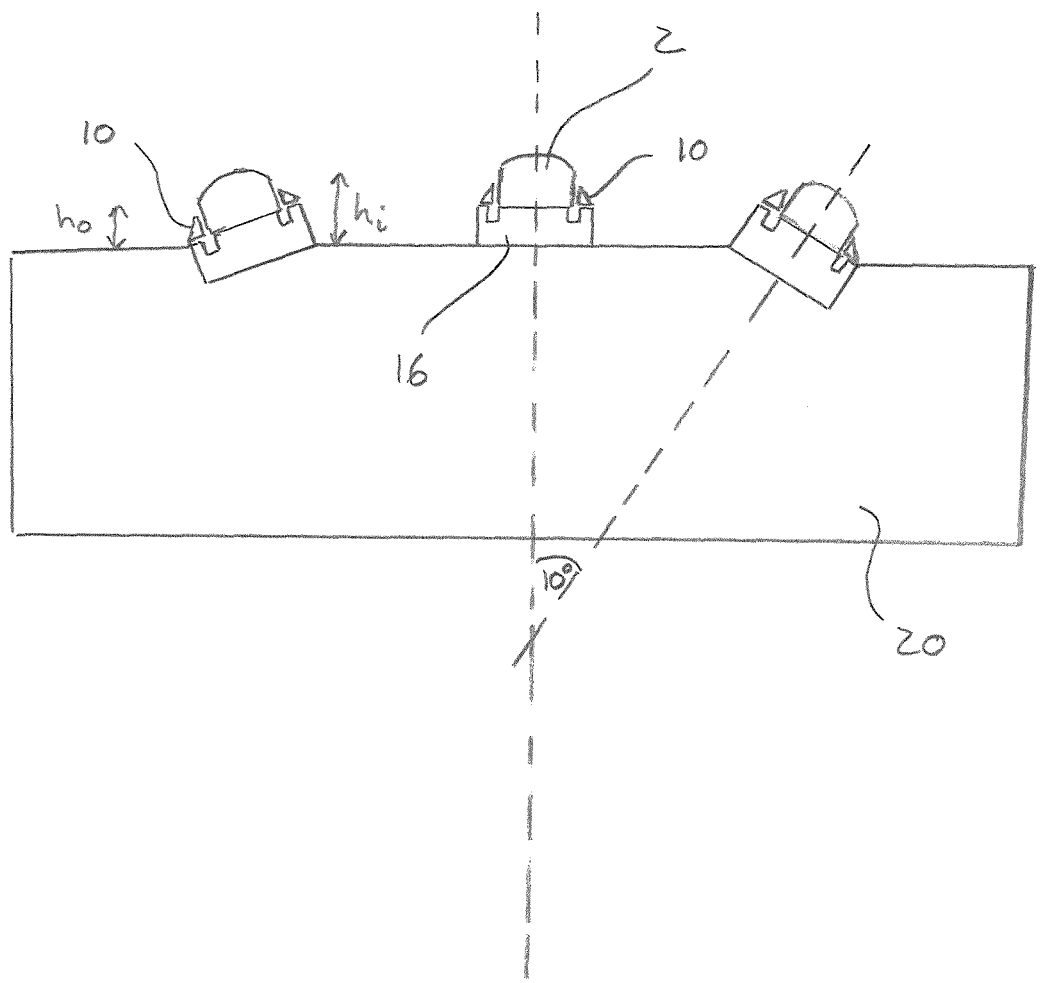
FIG. 5 illustrates a cross-sectional view of a platen comprising a plurality of pedestals on which carbide forming refractory metal substrates are disposed.

FIG. 5 illustrates a cross-sectional view of a platen 20 comprising a plurality of pedestals 16 on which carbide forming refractory metal substrates 2 and guard rings 10 are disposed. The illustrated platen is designed such that seven pedestals 16 are sunk at an angle of 10° into the surface of the platen around a single central pedestal at a radius of 43.8 mm. The outer pedestals are located at a height of 10 mm from the base of the platen whilst the central pedestal has a height of 8 mm.

As previously described, angling the off-axis substrates in this manner results in the outer edge of the off-axis substrates being lower in height than the height $h_i$ of the inner edge of the off-axis substrates. This tends to lower the electric field intensity at the outer edge of the off-axis substrates which is otherwise significantly higher than that at the inner edge of the substrates. Accordingly, this arrangement compensates for non-uniformities in the electric field intensity across the substrates and results in more uniform diamond deposition and crack-free delamination after growth.

Figure 6:
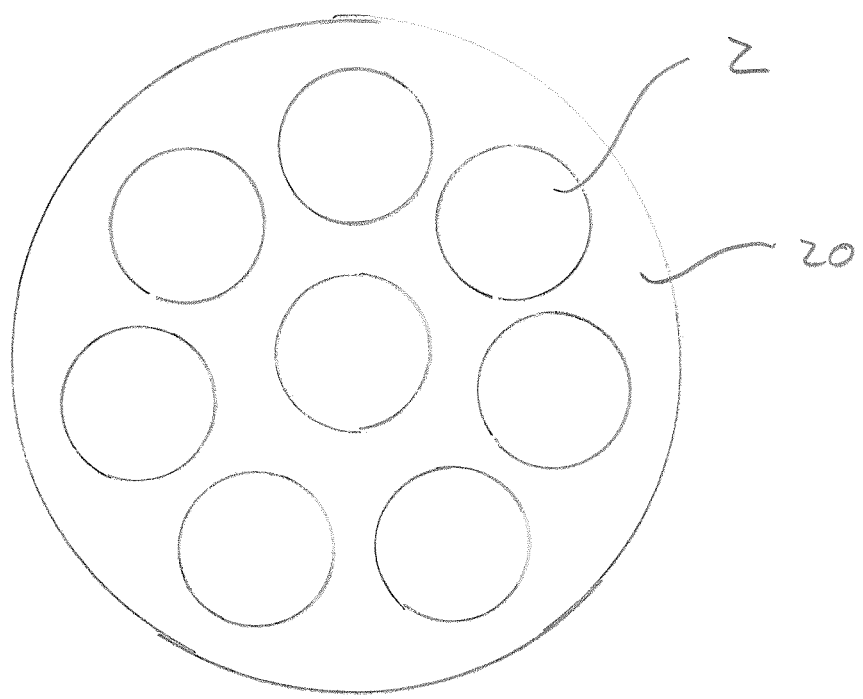
FIG. 6 illustrates a top view of the substrate/platen configuration shown in FIG. 5.

FIG. 6 illustrates a top view of the substrate/platen configuration shown in FIG. 5. The substrate configuration comprises one central and seven off-axis carbide forming refractory metal substrates 2 disposed on the platen 20. The off-axis substrates are evenly spaced in a circle around the central substrate. A prime number of evenly spaced off-axis substrates aids in maintaining electric field uniformity and thus uniform diamond deposition. To increase the number of substrate this seven off-axis arrangement could be re-configured to comprise eleven off-axis substrates. Higher prime numbers of off-axis substrates may be provided depending on the size of the platen and microwave plasma cavity although it may be noted that moving to larger diameters can be problematic in terms of maintaining plasma stability and uniform diamond deposition.

Figure 7:
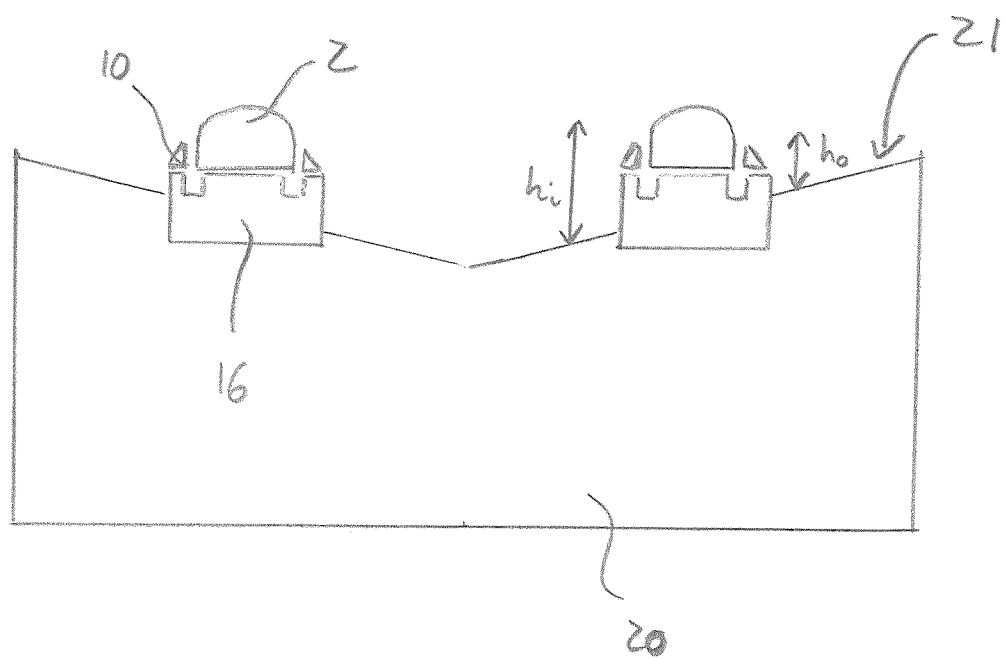
FIG. 7 illustrates a cross-sectional view of an alternative substrate/platen configuration.

FIG. 7 illustrates a cross-sectional view of an alternative substrate configuration. As in the arrangement shown in FIG. 5, the substrate configuration comprises a platen 20 comprising a plurality of pedestals 16 on which carbide forming refractory metal substrates 2 and guard rings 10 are disposed. However, instead of angling the platens/substrates, the upper surface of the platen is sloped such that the height of the outer edge $h_o$ of each substrate above the upper surface of the platen is less than the height $h_i$ of the inner edge of each substrate above the upper surface of the platen. This has the same technical effect of lowering the electric field intensity at the outer edge of each substrate such that it more closely matches the electric field intensity at the inner edge of each substrate. Variations such as stepped or curved platens may also be envisaged for ensuring that the height of the outer edge $h_o$ of each substrate above the upper surface of the platen is less than the height $h_i$ of the inner edge of each substrate above the upper surface of the platen.

As an alternative to the configurations shown in FIGS. 5 to 7, rather than, or in addition to, angling the substrates or top platen surface, mode cancelling blocks may be used to lower the electric field intensity at the outer edge of each substrate such that it more closely matches the electric field intensity at the inner edge of each substrate.

Figure 8:
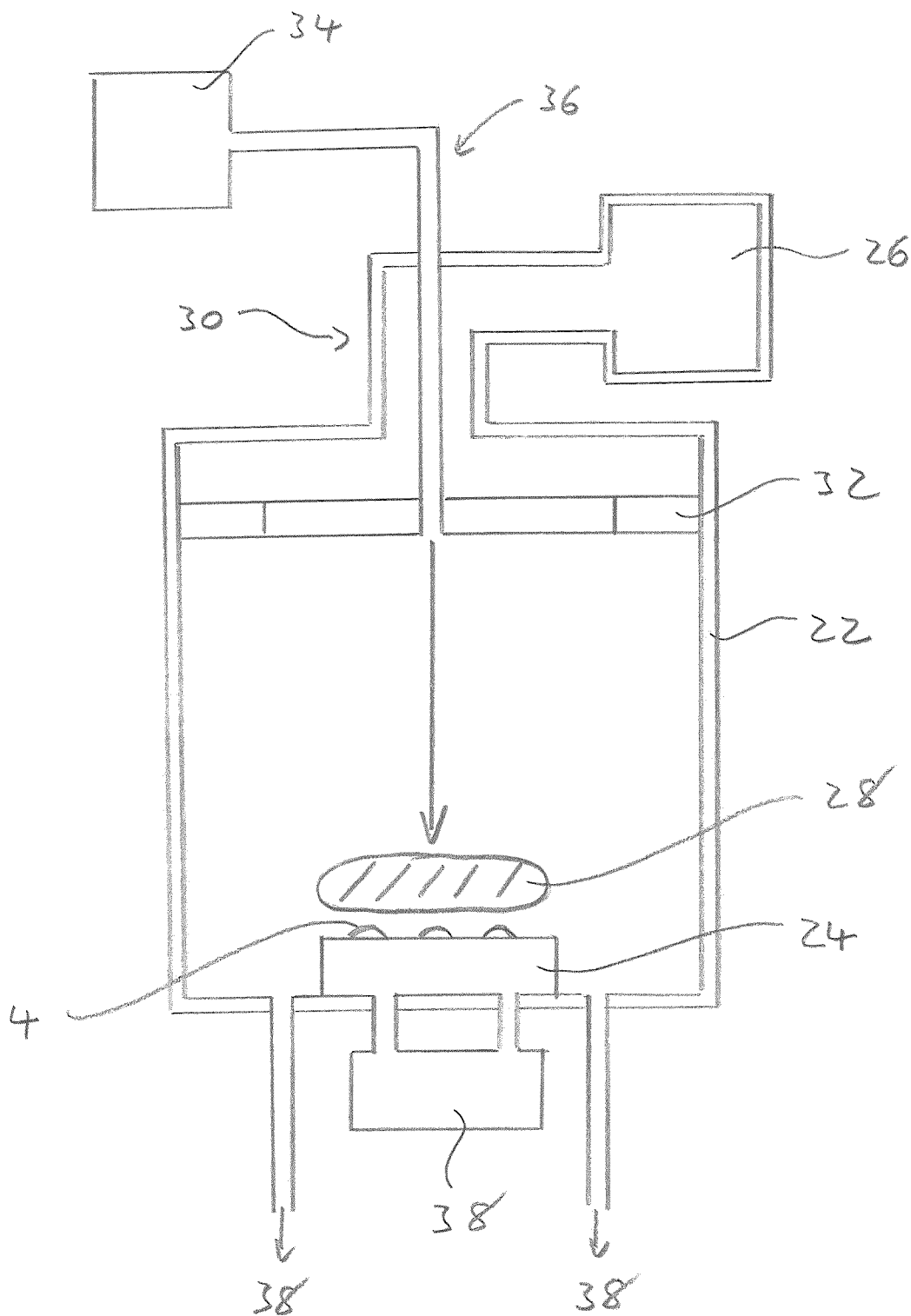
FIG. 8 illustrates a cross-sectional view of a microwave plasma reactor in which a substrate/platen configuration is disposed.

FIG. 8 illustrates a cross-sectional view of a microwave plasma reactor in which the substrate/platen configuration is disposed. The microwave plasma reactor comprises the following basic components: a plasma chamber 22; a platen 24 disposed in the plasma chamber for mounting dome-shaped substrates 4; a microwave generator 26 for forming a plasma 28 within the plasma chamber 22; a microwave coupling configuration 30 for feeding microwaves from the microwave generator 26 into the plasma chamber 22 via a coaxial waveguide and through an annular dielectric window 32; a gas flow system 34, 36, 38 for feeding process gases into the plasma chamber 22 and removing them therefrom; and a substrate coolant system 40 for controlling the temperature of a substrates 4.

During synthesis, an average substrate temperature may be controlled between 1050-1075° C. with a process gas flow $H_2$:Ar:$CH_4$ of 3000:43:93 sccm. According to certain embodiments no additional oxygen is provided in the gas flow. The microwave power is controlled to be 20 to 30 kW and the plasma chamber pressure is controlled to be 190 to 200 Torr. In addition, a controlled ramp down process, rather than a rapid cooling technique, is used. This involves a ramp down in pressure and power over 20 minutes, gradually cooling the substrate to 600° C. before extinguishing the plasma. The target thickness is 35 to 45 µm which should provide a dome mass in the region of 70 to 75 mg. There is some radial non-uniformity in the thickness of the dome which can be of the order of 22%. The circumferential spread is approximately 10%.

Post growth, very little processing is required. Substrates may require some re-preparation after a certain number of growth runs. The key is to ensure the low $R_a$ of the surface is intact and there is no debris on the side of the substrate which could interfere with the growth of the skirt region. The diamond dome itself may benefit from an acid clean before shipment but there is no requirement for laser cutting or profiling. Products may also be coated after fabrication, e.g. for aesthetic benefits.

While this invention has been particularly shown and described with reference to preferred embodiments, it will be understood to those skilled in the art that various changes in form and detail may be made without departing from the scope of the invention as defined by the appendant claims.

The invention claimed is:
1. A free-standing non-planar polycrystalline CVD synthetic diamond component which comprises a nucleation face and a growth face, the nucleation face comprising smaller grains than the growth face, the nucleation face having a surface roughness $R_a$ no more than 50 nm;
    wherein the free-standing non-planar polycrystalline CVD synthetic diamond component has a longest linear dimension when projected onto a plane of no less than 10 mm and is substantially crack free over at least a central region thereof, wherein the central region is at least 70% of a total area of the free-standing non-planar polycrystalline CVD synthetic diamond component;
    wherein the central region has no cracks which intersect both external major faces of the free-standing non-planar polycrystalline CVD synthetic diamond component and extend greater than 2 mm in length;
    wherein the free-standing non-planar polycrystalline CVD synthetic diamond component comprises a central dome-shaped portion with the growth face of the central dome-shaped portion being convex;

wherein the free-standing non-planar polycrystalline CVD synthetic diamond component further comprises a substantially cylindrical peripheral portion extending from an outer circumference of the dome-shaped portion and having side walls oriented within 20° of a central rotational axis of the free-standing non-planar polycrystalline CVD synthetic diamond component;

wherein the free-standing non-planar polycrystalline CVD synthetic diamond component has a thickness of no more than 100 μm; and wherein the component further comprises one or more of the following characteristics:

a silicon concentration as measured by secondary ion mass spectrometry of no more than $10^{17}$ atoms cm$^{-3}$;

a difference in silicon concentration between the nucleation face and the growth face of the free-standing non-planar polycrystalline CVD synthetic diamond component of no more than $10^{17}$ atoms cm$^{-3}$;

no detectable silicon carbide at the nucleation face of the free-standing non-planar polycrystalline CVD synthetic diamond component; and a detectable level of a refractory metal carbide at the nucleation face of the free-standing non-planar polycrystalline CVD synthetic diamond component.

2. A free-standing non-planar polycrystalline CVD synthetic diamond component according to claim 1, wherein the central region is at least 80% of a total area of the free-standing non-planar polycrystalline CVD synthetic diamond component.

3. A free-standing non-planar polycrystalline CVD synthetic diamond component according to claim 1, wherein the central region has no cracks which intersect both external major faces of the free-standing non-planar polycrystalline CVD synthetic diamond component and extend greater than 1.0 mm in length.

4. A free-standing non-planar polycrystalline CVD synthetic diamond component according to claim 1, wherein the surface roughness $R_a$ of the nucleation face is no more than 20 nm.

5. A free-standing non-planar polycrystalline CVD synthetic diamond component according to claim 1, having a longest linear dimension when projected onto a plane of no less than 15 mm.

6. A free-standing non-planar polycrystalline CVD synthetic diamond component according to claim 5, wherein said longest linear dimension is in a range 15 mm to 35 mm.

7. A free-standing non-planar polycrystalline CVD synthetic diamond component according to claim 1, wherein said thickness lies in a range 30 μm to 80μm.

8. A free-standing non-planar polycrystalline CVD synthetic diamond component according to claim 1, wherein the dome-shaped portion has a radius of curvature in a range 10 mm to 80 mm.

9. A free-standing non-planar polycrystalline CVD synthetic diamond component according to claim 1, wherein the dome-shaped portion has a radial thickness variation of no more than 40% of a mean radial thickness.

10. A free-standing non-planar polycrystalline CVD synthetic diamond component according to claim 1, wherein the dome-shaped portion has a circumferential thickness variation of no more than 20% of a mean circumferential thickness.

11. A free-standing non-planar polycrystalline CVD synthetic diamond component according to claim 1, wherein the substantially cylindrical peripheral portion comprises two portions including a main side wall portion and an angled transition portion adjacent the outer circumference of the dome-shaped portion disposed between the main side wall portion and the dome-shaped portion, wherein the angled transition portion forms an angle in a range 2° to 20° relative to the central rotational axis of the free-standing non-planar polycrystalline CVD synthetic diamond component, and wherein the angle of the angled transition portion is larger than an angle formed by the main side wall portion relative to the central rotational axis of the free-standing non-planar polycrystalline CVD synthetic diamond component.

12. A free-standing non-planar polycrystalline CVD synthetic diamond component according to claim 1, wherein the substantially cylindrical peripheral portion has a depth in a range 0.2 mm to 2.0 mm.

13. A free-standing non-planar polycrystalline CVD synthetic diamond component according to claim 1, wherein the dome-shaped free-standing on-planar polycrystalline CVD synthetic diamond component has a mass in a range 50 mg to 110 mg.

* * * * *